(12) United States Patent
Yamauchi et al.

(10) Patent No.: US 7,553,731 B2
(45) Date of Patent: Jun. 30, 2009

(54) METHOD OF MANUFACTURING SEMICONDUCTOR DEVICE

(75) Inventors: Shoichi Yamauchi, Nagoya (JP); Yoshiyuki Hattori, Aichi-gun (JP); Kyoko Okada, Nagoya (JP)

(73) Assignee: DENSO CORPORATION, Kariya (JP)

( * ) Notice: Subject to any disclaimer, the term of this patent is extended or adjusted under 35 U.S.C. 154(b) by 12 days.

(21) Appl. No.: 11/806,862

(22) Filed: Jun. 5, 2007

(65) Prior Publication Data

US 2007/0238271 A1    Oct. 11, 2007

Related U.S. Application Data

(62) Division of application No. 11/301,249, filed on Dec. 13, 2005, now Pat. No. 7,417,284.

(30) Foreign Application Priority Data

Dec. 13, 2004   (JP)   ............................. 2004-360317

(51) Int. Cl.
*H01L 21/336* (2006.01)
*H01L 21/04* (2006.01)

(52) U.S. Cl. .................. 438/270; 438/271; 438/268; 257/341

(58) Field of Classification Search ......... 438/270–271, 438/268, 510, 514; 257/341–342, E21.336, 257/E21.04
See application file for complete search history.

(56) References Cited

U.S. PATENT DOCUMENTS

| 5,216,275 | A | 6/1993 | Chen |
| 6,512,268 | B1 | 1/2003 | Ueno et al. |
| 6,551,909 | B1 * | 4/2003 | Fujihira ............... 438/510 |
| 6,639,260 | B2 * | 10/2003 | Suzuki et al. ............ 257/288 |
| 6,693,338 | B2 | 2/2004 | Saitoh et al. |
| 6,700,141 | B2 * | 3/2004 | Iwamoto et al. ............ 257/110 |
| 6,724,042 | B2 | 4/2004 | Onishi et al. |
| 6,768,138 | B1 | 7/2004 | Kitada et al. |
| 6,825,565 | B2 | 11/2004 | Onishi et al. |
| 6,844,592 | B2 | 1/2005 | Yamaguchi et al. |
| 2001/0028083 | A1 | 10/2001 | Onishi et al. |

(Continued)

FOREIGN PATENT DOCUMENTS

JP   A-2004-22716   1/2004

(Continued)

OTHER PUBLICATIONS

Advisory Action dated Mar. 25, 2008 in U.S. Appl. No. 11/301,249.

(Continued)

*Primary Examiner*—Theresa T Doan
(74) *Attorney, Agent, or Firm*—Posz Law Group, PLC

(57) ABSTRACT

A semiconductor device having SJ structure has a peripheral region having a higher withstand voltage than the withstand voltage of the cell region. A semiconductor upper layer including second conductivity-type impurities and a semiconductor lower layer including first conductivity-type impurities whose concentration is lower than the first portion region constituting the combination of the cell region are formed in the semiconductor layer of the peripheral region. A field oxide layer is formed on a surface of the semiconductor upper layer.

5 Claims, 6 Drawing Sheets

U.S. PATENT DOCUMENTS

| | | |
|---|---|---|
| 2002/0074596 A1 | 6/2002 | Suzuki et al. |
| 2003/0160262 A1 | 8/2003 | Kitada et al. |
| 2003/0222327 A1* | 12/2003 | Yamaguchi et al. ......... 257/500 |
| 2003/0224588 A1* | 12/2003 | Yamauchi et al. ........... 438/524 |
| 2004/0016959 A1 | 1/2004 | Yamaguchi et al. |
| 2004/0094819 A1 | 5/2004 | Saitoh et al. |
| 2005/0077572 A1 | 4/2005 | Yamaguchi et al. |

FOREIGN PATENT DOCUMENTS

| | | | |
|---|---|---|---|
| JP | WO 2005/020275 A2 | 3/2005 | |

OTHER PUBLICATIONS

U.S. Appl. No. 11/211,524, filed Aug. 26, 2005, Yamaguchi et al.
Notice of Allowance dated May 1, 2008 in U.S. Appl. No. 11/301,249.
Office Action dated Jun. 26, 2007 in parent U.S. Appl. No. 11/301,249.
Office Action dated Sep. 21, 2007 in corresponding Chinese Patent Application No. 200510129496.3 (and English translation).
Office Action dated Dec. 6, 2007 in parent U.S. Appl. No. 11/301,249.

* cited by examiner

CELL REGION | PERIPHERAL REGION

METHOD OF MANUFACTURING SEMICONDUCTOR DEVICE

CROSS REFERENCE TO RELATED APPLICATION

This application is a division of application Ser. No. 11/301,249 filed on Dec. 13, 2005, which is based upon, claims the benefit of priority of, and incorporates by reference the contents of, Japanese Patent Application No. 2004-360317 filed on Dec. 13, 2004.

TECHNICAL FIELD

The technical field relates to a semiconductor device having a cell region including a vertical semiconductor switching cell group formed therein, and a peripheral region located around the cell region. Particularly, the technical field relates to a semiconductor device having a super junction structure (hereinafter abbreviated as SJ structure) in which a combination of a first portion region including first-conductivity-type impurities and a second portion region including second-conductivity-type impurities is repetitively formed in the cell region, and also the withstand voltage of the peripheral region is higher than the withstand voltage of the cell region.

BACKGROUND

In order to meet requirements of increasing the withstand voltage of the semiconductor device and reducing the ON resistance of the semiconductor device, semiconductor devices having the SJ structure are being developed. This type of semiconductor device is generally formed by using a semiconductor layer that is continuously formed over the area extending from the cell region to the peripheral region. In many cases, the SJ structure is formed at the center side region of the semiconductor layer, and a peripheral semiconductor layer making a circuit of the SJ structure is formed at the peripheral side. In the SJ structure, a combination of an n-type column including n-type impurities and a p-type column including p-type impurities is repetitively formed within a plane perpendicular to the layer thickness direction. The peripheral semiconductor layer is formed of a semiconductor including n-type impurities. A p-type body region is formed at the upper area of the SJ structure in the cell region, and a planar type gate electrode or trench type gate electrode is formed so as to confront the p-type body region. A plurality of vertical semiconductor switching cells are formed in the cell region, and execute ON/OFF operation. For example, JP-A-2003-273355 (see FIG. 14) and JP-A-2004-14554 disclose this type of semiconductor device.

An avalanche breakdown resistance testing of a semiconductor device is carried out by an L load surge breakdown resistance testing or the like. In the L load surge breakdown resistance testing, the semiconductor device is forced to induce breakdown therein. The breakdown occurs in an area beyond the critical electric field intensity. Considering the ratio in area between the cell region and the peripheral region, avalanche energy per unit area can be reduced to a smaller value by inducing breakdown at the cell region side having a larger area as compared with a case where breakdown is induced at the peripheral region side having a smaller area. Therefore, by inducing the breakdown at the cell region side, excessive avalanche energy can be suppressed from being locally consumed, and thus there can be avoided such a situation that the semiconductor device is broken. In order to achieve the above phenomenon, the withstand voltage of the peripheral region is set to be larger than the withstand voltage of the cell region so that breakdown occurs preferentially in the cell region.

However, the semiconductor device disclosed in JP-A-2003-273355 cannot achieve the state that the withstand voltage of the peripheral region is higher than the withstand voltage of the cell region. The above publication proposes a structure that the concentration of the impurities of the peripheral semiconductor layer is reduced and plural p-type guard ring regions making a circuit of the cell region are provided at the upper area of the peripheral semiconductor layer. By reducing the concentration of the impurities of the peripheral semiconductor layer, the width of a depletion layer extending in the lateral direction in the peripheral semiconductor layer can be increased. Furthermore, by forming the p-type guard ring regions, the electric field which tends to concentrate in the neighborhood of the boundary between the cell region and the peripheral region can be moderated. By adopting this structure, the electric field which tends to concentrate in the neighborhood of the boundary between the cell region and the peripheral region can be moderated, and a depleted region expanding in the lateral direction can be sufficiently achieved, so that the withstand voltage of the peripheral region is determined by the width in the longitudinal direction of the depleted region.

Since the concentration of the impurities of the p-type guard ring is set to a relatively high value, and thus the depletion layer slightly extends into the p-type guard ring. Accordingly, the width in the longitudinal direction of the depleted region of the peripheral region is substantially equal to a value achieved by subtracting the depth of the p-type guard ring from the layer thickness of the peripheral semiconductor layer. On the other hand, the width in the longitudinal direction of the depleted region of the cell region is equal to the width achieved by subtracting the depth of the p-type body region from the layer thickness of the semiconductor layer, that is, the width in the longitudinal direction of the SJ structure.

The p-type body region and the p-type guard ring are substantially equal in depth to each other, and thus the width in the longitudinal direction of the depleted region of the cell region is substantially equal to the width in the longitudinal direction of the depleted region of the peripheral region. If the depth of the p-type body region is needlessly increased, the withstand voltage of the peripheral region can be set to be higher than the withstand voltage of the cell region, however, the withstand voltage of the cell region is sacrificed. The limitation of the conventional structure resides in that the withstand voltage of the peripheral region is increased to be equal to the withstand voltage of the cell region at maximum, and it cannot be increased to be larger than the withstand voltage of the cell region.

SUMMARY

It is an object to provide a semiconductor device including a peripheral region and a cell region formed so that the withstand voltage of the peripheral region is higher than the withstand voltage of the cell region.

It is another object to provide a semiconductor device having the above relationship not by reducing the withstand voltage of the cell region, but increasing the withstand voltage of the peripheral region.

In order to attain the above objects, a semiconductor device includes a cell region in which a vertical semiconductor switching cell group is formed, and a peripheral region located on the periphery of the cell region. The semiconductor device has a semiconductor layer that is continuously formed from the cell region to the peripheral region. The semiconductor device is further equipped with an insulating layer covering the surface of the semiconductor layer in the peripheral region. Furthermore, the semiconductor device is further equipped with a conductor layer covering at least the surface of the insulating layer at the cell region side. A combination of a first portion region extending in the layer thickness direction and including first conductivity-type impurities and a second portion region extending in the layer thickness direction and including second conductivity-type impurities is formed at the lower region of the semiconductor layer of the cell region. This combination is repetitively formed in a plane perpendicular to the layer thickness direction. An SJ structure is formed at the lower region of the semiconductor layer. A semiconductor upper layer including second conductivity-type impurities and a semiconductor lower layer including first conductivity-type impurities whose concentration is lower than the first portion region constituting the combination of the cell region are formed in the semiconductor layer of the peripheral region. The conductor layer is connected to a main electrode at the surface side that constitutes the vertical semiconductor switching cell group.

The first portion region and the second portion region are designed in a thin-plate shape, a quadratic-prism shape or a hexagonal-cylinder shape, for example. Cylindrical second portion regions may be dispersively arranged in the first portion regions broadly expanding in the plane perpendicular to the layer thickness direction. In short, it is sufficient only that the combination of the first portion region and the second portion region is repeated at least in one direction in the plane perpendicular to the layer thickness direction.

The type of the vertical semiconductor switching cells formed in the cell region is not limited to a specific one. For example, MOSFET (Metal Oxide Silicon Field Effect Transistor), IGBT (Insulated Gate Bipolar Transistor), SIT (Static Induction Transistor) or SBT (Shottky Barrier Diode) or the like may be properly used as the vertical semiconductor switching cell. The gate electrode constituting the vertical semiconductor switching cell may be formed of any one of a trench type and a planar type.

Since the vertical semiconductor switching cells are formed in the cell region of the semiconductor device, a pair of main electrodes are formed in the vertical direction. Accordingly, the withstanding voltage of the semiconductor device is determined by the potential difference which can be held in the vertical direction. In the semiconductor device, the concentration of the first conductivity-type impurities of the peripheral semiconductor lower layer is set to be lower than the concentration of the impurities of the first portion region of the cell region, and thus the depletion layer can expand broadly in the lateral direction in the semiconductor lower layer. Accordingly, in the semiconductor lower layer, the potential difference can be sufficiently held in the lateral direction and thus the withstand voltage of the peripheral region is determined by the width of the depleted region formed in the vertical direction. A semiconductor upper layer having the opposite conductivity type to the semiconductor lower layer is formed on the surface of the peripheral semiconductor lower layer. Accordingly, the depletion layer can expand not only to the semiconductor lower layer, but also to the semiconductor upper layer, whereby the width in the vertical direction of the depleted region of the peripheral region is equal to the total width of the peripheral semiconductor lower layer and the peripheral semiconductor upper layer.

On the other hand, the width in the vertical direction of the depleted region of the cell region is substantially equal to the layer thickness of the lower portion region in which the SJ structure is formed. Accordingly, comparing the width in the vertical direction of the depleted region between the peripheral region and the cell region, the width in the vertical direction of the depleted region of the peripheral region is larger by the amount corresponding to the subtraction of the layer thickness of the lower portion region having the SJ structure formed therein from the layer thickness of the semiconductor layer. In other words, the width in the vertical direction of the depleted region of the peripheral region is larger by the amount corresponding to the distance between the surface of the SJ structure and the surface of the semiconductor layer. Accordingly, there can be achieved a semiconductor device in which the withstand voltage of the peripheral region is larger than the withstand voltage of the cell region. Furthermore, a semiconductor layer is formed through an insulating layer at the surface side of the peripheral region, thereby moderating the concentration of electric field which tends to concentrate in the neighborhood of the boundary between the cell region and the peripheral region (typically, a place having a large curvature of the semiconductor region existing in the neighborhood of the boundary). Accordingly, the withstand voltage of the semiconductor device can be prevented from being limited in the neighborhood of the boundary by existence of the conductor layer. That is, the withstand voltages of the cell region and peripheral region are determined by the widths in the vertical direction of the depleted regions thereof irrespective of the concentration of the electric field at the boundary between the cell region and the peripheral region. The withstand voltage of the peripheral region whose depleted region has a larger width in the vertical direction than that of the cell region is higher than the withstand voltage of the cell region. Furthermore, the relationship in magnitude of the withstand voltage between the cell region and the peripheral region is not implemented by reducing the withstand voltage of the cell region, but by increasing the withstand voltage of the peripheral region.

It is preferable that the semiconductor upper layer extends to the upper side of the super junction structure of the cell region. In other words, it is preferable that the semiconductor upper layer is formed so as to cover the surface of the peripheral semiconductor lower layer and the surface of the super junction structure of the cell region.

The semiconductor upper layer of the cell region is used as the body layer of the semiconductor switching cell or the like, for example. As described above, the semiconductor upper layer of the peripheral region is used as the semiconductor layer contributing to increase of the withstand voltage. Accordingly, one semiconductor upper layer can serve both as the semiconductor layer exhibiting an action at the cell region side and as the semiconductor layer exhibiting another action at the peripheral region side. It is unnecessary to individually manufacture each of the semiconductor layers at the cell region side and the peripheral region side, and the two actions can be achieved by manufacturing one semiconductor upper layer. Accordingly, it is understood that the semiconductor device described above has a structure which can be readily manufactured.

It is preferable that a source region including a high concentration of first conductivity-type impurities and a trench gate electrode which confronts through a gate insulating film a semiconductor upper layer for separating the source region and the first portion region from each other are formed in a second conductivity-type semiconductor upper layer extending to the upper side of the super junction structure. A body region including second conductivity-type impurities surrounding the source region may be formed in the semiconductor upper layer of the cell region as occasion demands. The threshold value of the gate voltage can be adjusted to a desired value by forming the body region. By providing the above structure, the vertical semiconductor switching cell formed in the cell region serves as MOSFET having a trench gate electrode.

In this case, the width in the vertical direction of the depleted region of the cell region is equal to the width from the bottom surface of the trench gate electrode to the back surface of the semiconductor layer. Accordingly, the width in the vertical direction of the depleted region of the peripheral region is larger than the width of the depleted region of the cell region by the amount corresponding to the width in the depth direction of the trench gate electrode. Accordingly, there can be achieved a semiconductor device in which the withstand voltage of the peripheral region is larger than the withstand voltage of the cell region.

The applicants have created a method of manufacturing a semiconductor device having a cell region having a vertical semiconductor switching cell group formed therein and a peripheral region located on the periphery of the cell region. This manufacturing method is suitably used to manufacture the semiconductor device described above.

The semiconductor device manufacturing method comprises preparing a first conductivity-type semiconductor layer continuously extending from a cell region to a peripheral region, and a step of forming a trench group extending from the surface of the semiconductor layer to the back surface of the semiconductor layer. Furthermore, the manufacturing method further comprises doping first conductivity-type impurities to the exposed surface of the semiconductor layer. The manufacturing method further comprises removing a surface neighboring region of the semiconductor layer doped with the first conductivity-type impurities, and filling a semiconductor including second conductivity-type impurities into the trench group.

According to the manufacturing method described above, by forming the trench group in the cell region, plural semiconductor layers (or semiconductor layers existing so as to be far away from one another) sandwiched between neighboring trenches are designed so that the distance from the side surface thereof to the deep portion thereof is short. Accordingly, by executing the doping step, the plural semiconductor layers in the cell region are liable to be doped with impurities from the side surfaces for defining the trenches formed at both the sides thereof until the deep portions thereof. Accordingly, by adjusting the doping amount of the impurities, the concentration of the impurities of the semiconductor layer in the cell region which is sandwiched between the neighboring trenches is increased. On the other hand, with respect to the semiconductor layer of the peripheral region, the impurities are doped from the surface by a predetermined distance, however, it is impossible to dope the impurities till the deep portion.

Subsequently, the surface neighboring region of the semiconductor layer doped with the first conductivity-type impurities is removed, whereby a semiconductor layer in which the concentration of the impurities is not varied is formed in the peripheral region. Accordingly, there can be achieve such a state that the concentration of the impurities is high in the cell region and the concentration of the impurities is low in the peripheral region. Subsequently, by filling the semiconductor including the second conductivity-type impurities into the trench group, the SJ structure is formed in the cell region. Through these steps, there can be achieved the semiconductor layer in which the SJ structure is formed in the cell region, and the semiconductor layer including the impurities whose concentration is lower than the concentration of the impurities of one portion region constituting the SJ structure is formed in the peripheral region.

It is preferable that in the doping step, the exposure surface of the semiconductor layer is exposed to gas including first conductivity-type impurities.

By using the gas including the first conductivity-type impurities, a desired concentration of first conductivity-type impurities is readily doped to the surface of the semiconductor layer and the side surfaces of the semiconductor layer for defining the group of the trenches, that is, all the exposure surfaces of the semiconductor layer.

Furthermore, a chamber used in a subsequent filling step is available and thus this method is advantageous in manufacturing cost.

It is preferable to further provide a step of removing the semiconductor including the second conductivity-type impurities covering the surface of the semiconductor layer to expose the filled trench group after the filling step is executed. Furthermore, it is preferable to further provide a step of forming a semiconductor upper layer including second conductivity-type impurities on the surfaces of the semiconductor layer and the filled trench group including second-conductivity type impurities by crystal growth after the removing step is executed.

By adding the above step, the semiconductor upper layer including a desired concentration of impurities can be achieved. For example, there can be achieved a semiconductor upper layer optimal to form the depleted region, moderate the concentration of the electric field, etc. When the semiconductor is filled in the trench group, the semiconductor upper layer can be integrally formed, and the removing step can be omitted. In this case, the number of steps can be reduced, and thus this method is advantageous in manufacturing cost.

The width in the vertical direction of the depleted region of the peripheral region can be set to be larger than the width in the vertical direction of the depleted region of the cell region. Accordingly, there can be achieved a semiconductor device in which the withstand voltage of the peripheral region is larger than the withstand voltage of the cell region.

BRIEF DESCRIPTION OF THE DRAWINGS

Additional objects, features and advantages will be best understood from the following description, the appended claims and the accompanying drawings in which:

DETAILED DESCRIPTION OF THE PREFERRED EMBODIMENTS

Preferred embodiments will be described hereunder with reference to the accompanying drawings.

First, main features of an embodiment will be described.

(First Feature) A semiconductor device has a cell region in which a vertical semiconductor switching cell group is formed, and a peripheral region located on the periphery of the cell region. The cell region has a SJ structure. The peripheral cell is equipped with a semiconductor lower layer including impurities whose concentration is lower than that of one portion region constituting the SJ structure of the cell region. A semiconductor upper layer of the opposite conductivity-type to the semiconductor lower layer is provided on the surface of the peripheral semiconductor lower layer. An insulating layer is provided on the surface of the semiconductor upper layer. A conductor layer is provided on the surface of the insulting layer so as to be connected to a main electrode at the surface side of the vertical semiconductor switching cell group. The conductor layer is formed so as to extend from the cell region side to the periphery.

(Second Feature) There exists a first conductivity-type semiconductor region (in this embodiment, hereinafter referred to as "boundary n-type column") that is along the repetitive direction of the SJ structure, has substantially the same impurity concentration as the first conductivity-type portion region of the SJ structure and has a width smaller than that of the other first conductivity-type portion region.

(Third Feature) The semiconductor upper layer is expanded in a planar style (two-dimensionally).

(Fourth Feature) The semiconductor upper layer is coated on the whole surface of the peripheral semiconductor lower layer.

(Fifth Feature) The impurity concentration of the semiconductor upper layer is substantially equal to that of the p-type column.

Embodiments

Figure 1:
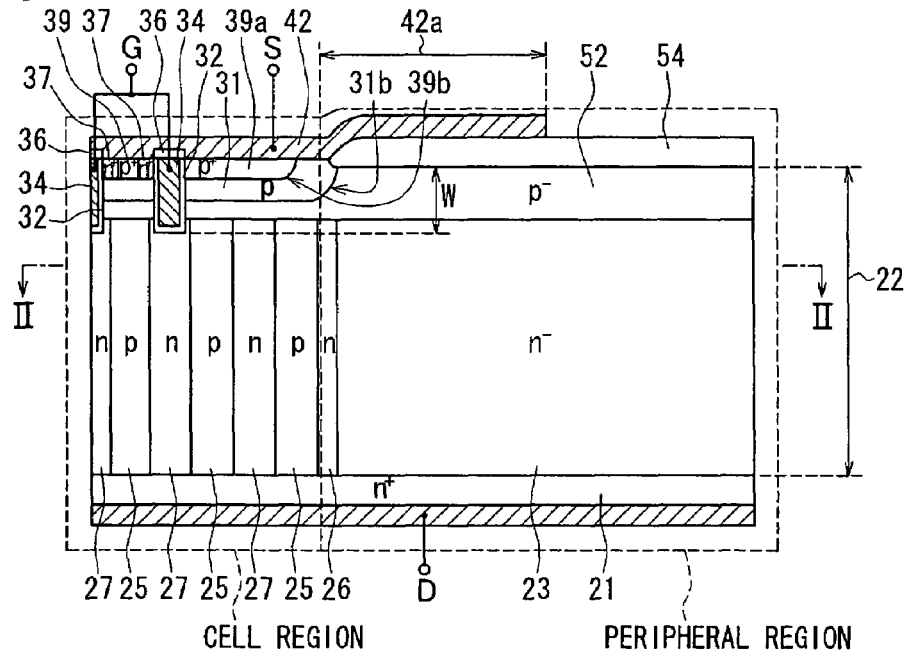
FIG. 1 is a cross-sectional view showing a main portion of an embodiment.
Figure 2:
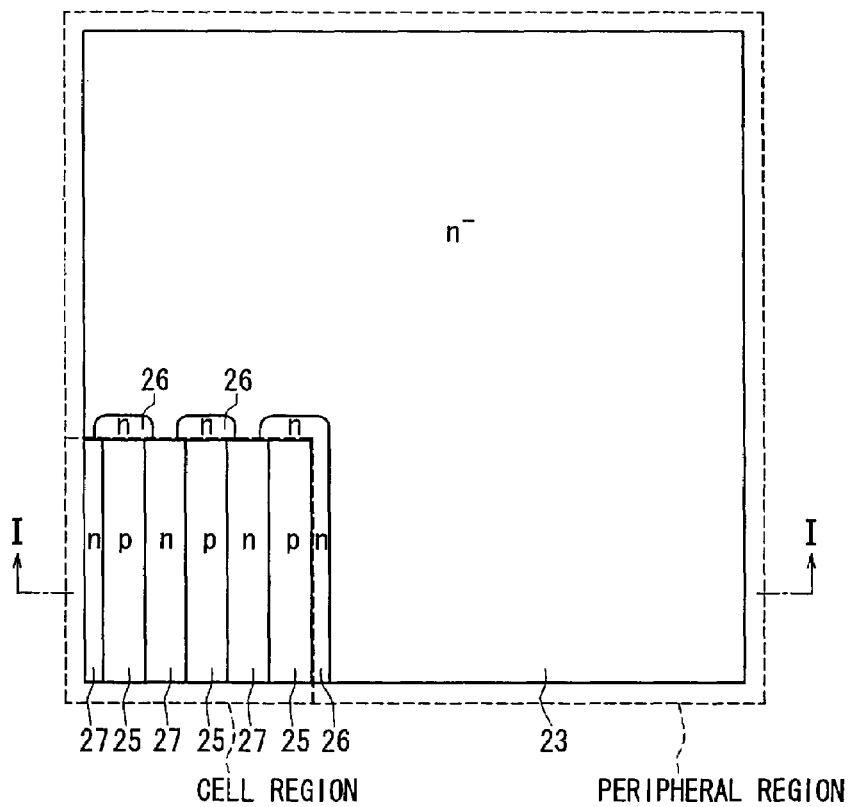
FIG. 2 is a laterally-sectional view taken along a line II-II of FIG. 1.

FIG. 1 is a cross-sectional view showing a main part in the neighborhood of the boundary between the cell region and the peripheral region. FIG. 2 is a laterally sectional view taken along II-II line of FIG. 1. The longitudinally-sectional view of FIG. 1 is taken along II-II line of FIG. 2. As shown in FIG. 2, the laterally-sectional view shows the neighborhood of a corner of the semiconductor device. This embodiment uses a semiconductor formed of silicon as a main component, however, other semiconductor materials may be used in place of silicon.

As shown in FIGS. 1 and 2, the semiconductor device has a cell region in which a vertical semiconductor switching cell group (in this embodiment, SJ-MOSFET group) is formed, and a peripheral region located on the periphery of the cell region. The peripheral region makes a circuit of the cell region. The semiconductor device is equipped with a semiconductor layer 22 formed continuously from the cell region to the peripheral region. A field oxide layer 54 (an example of an insulating layer) is coated on the surface of the semiconductor layer 22 of the peripheral region. The layer thickness of the field oxide layer 54 is set to about 1 to 1.5 μm, for example. A field plate 42*a* is coated at at least the cell region side of the surface of the field oxide layer 54. The field plate 42*a* is provided so as to extend from the cell region side to the periphery. The field plate 42*a* is a part of the source electrode 42, and it means a part extending on the surface of the field oxide layer 54. The extension length of the field plate 42*a* at the peripheral side is not particularly limited, and the field plate 42*a* is formed at the length optimal to the moderation of the electric field at the surface side.

A combination of an n-type column 27 (an example of a first portion region) extending in the layer thickness (the vertical direction of the drawing surface of FIG. 1) and a p-type column 25 (an example of a second portion region) extending in the layer thickness direction is repetitively formed in a plane perpendicular to the layer thickness direction in the lower region of the semiconductor layer 22 of the cell region, thereby constructing a so-called SJ structure. The plane perpendicular to the layer thickness direction corresponds to the laterally sectional view of FIG. 2. In this embodiment, the n-type column 25 and the p-type column 27 can be estimated as having a substantially thin-plate shape, and the combination thereof is repeated in the right-and-left direction on the drawing surface of FIG. 2. A boundary n-type column 26 is formed at the boundary between the cell region and the peripheral region so that the width thereof is narrower than the widths of the other n-type columns 27. Existence of the boundary n-type column 26 can be understood by the manufacturing method described later. In this embodiment, the inner portion extending from the boundary between the boundary n-type column 26 and the neighboring p-type column 25 to the center side will be referred to as the cell region, and the outer portion extending from the boundary concerned to the outside will be referred to as the peripheral region. It is unnecessary that this discrimination is particularly limited, and the boundary n-type column 26 may contain the cell region.

An n⁻ type semiconductor lower layer 23 and a p⁻ type reduced surface field (RESURF) layer 52 (an example of the semiconductor upper layer) are formed in the semiconductor layer 22 of the peripheral region. The concentration of the impurities of the semiconductor lower layer 23 is lower than that of the n-type column 27 constituting the SJ structure. The layer thickness of the semiconductor lower layer 23 is set to about 10 to 13 μm in a 200V withstand voltage system. The layer thickness of the reduced surface field layer 52 is set to about 1 to 3 μm, for example. Another structure may be formed at a portion located at a further outer position (not shown) from the peripheral region. For example, an insulating and separating trench, a channel stopper region or the like may be provided as another structure, for example.

Next, the structure of the cell region will be described. The reduced surface field layer 52 is continuously formed from the peripheral region in the upper region of the semiconductor layer 22 of the cell region. Or, the reduced surface field layer 52 may be formed so as to extend to the upper side of the SJ structure. A p-type body region 31 is formed on the surface portion of the reduced surface field layer 52. The concentration of the impurities of the body region 31 is higher than that of the reduced surface field layer 52. The threshold value of the gate voltage can be adjusted by adjusting the impurity concentration of the body region 31. An n+-type source region 37 and a p+-type body contact region 39 are selectively formed on the surface portion of the body region 31. The body contact region located at the outermost periphery of the cell region in the body contact region 39 will be referred to as an outermost peripheral body contact region 39a to discriminate it from the other body contact regions 39. A trench gate electrode 34 is formed so as to penetrate through the body region 31 and the reduced surface field layer 52 through which the source region 37 and the n-type column 27 are far away from each other. The trench gate electrode 34 is covered by gate insulating film 32. The source region 37 and the body contact region 39 are electrically connected to the source electrode 42. The source electrode 42 and the trench gate electrode 34 are electrically insulated from each other through interlayer insulating film 36. An n+-type drain layer 21 expanding in a planar style (two-dimensionally) is formed on the back surface of the semiconductor layer 22. The drain layer 21 is continuously formed over the area extending from the cell region to the peripheral region. A drain electrode D electrically connected to the drain layer 21 is formed on the back surface of the drain layer 21. The drain layer 21 contains a high concentration of impurities, and it can be regarded substantially as a conductor.

The impurity concentration of each of the constituent elements of the semiconductor device described above is preferably manufactured according to the following values.

It is preferable that the impurity amounts of the n-type column 27 and the p-type column 25 are charge-balanced with each other. The region of the SJ structure can be perfectly depleted. The n-type column 27 is preferably designed to have a high concentration in order to reduce the ON resistance thereof. In this embodiment, for example, the impurity concentration of the n-type column 27 is set to a value satisfying the RESURF (reduced surface field) condition.

The impurity concentration of the peripheral semiconductor lower layer 23 is preferably set to be lower than that of the n-type column 27. In the semiconductor lower layer 23, the depletion layer can be broadly expanded in the lateral direction. The impurity concentration of the semiconductor lower layer 23 is preferably set to $1/10$ or less of the impurity concentration of the n-type column 27. In this case, as described later, even when the impurity concentration of the semiconductor lower layer 23 is dispersed, the reduction of the withstand voltage in the peripheral region can be suppressed. In this embodiment, for example, the impurity concentration of the semiconductor lower layer 23 is set to $5 \times 10^{14}$ cm$^{-3}$.

The impurity concentration of the reduced surface field layer 52 is preferably set to $5 \times 10^{15}$ cm$^{-3}$ or less. In this embodiment, for example, it is set to $3 \times 10^{15}$ cm$^{-3}$.

Figure 3:
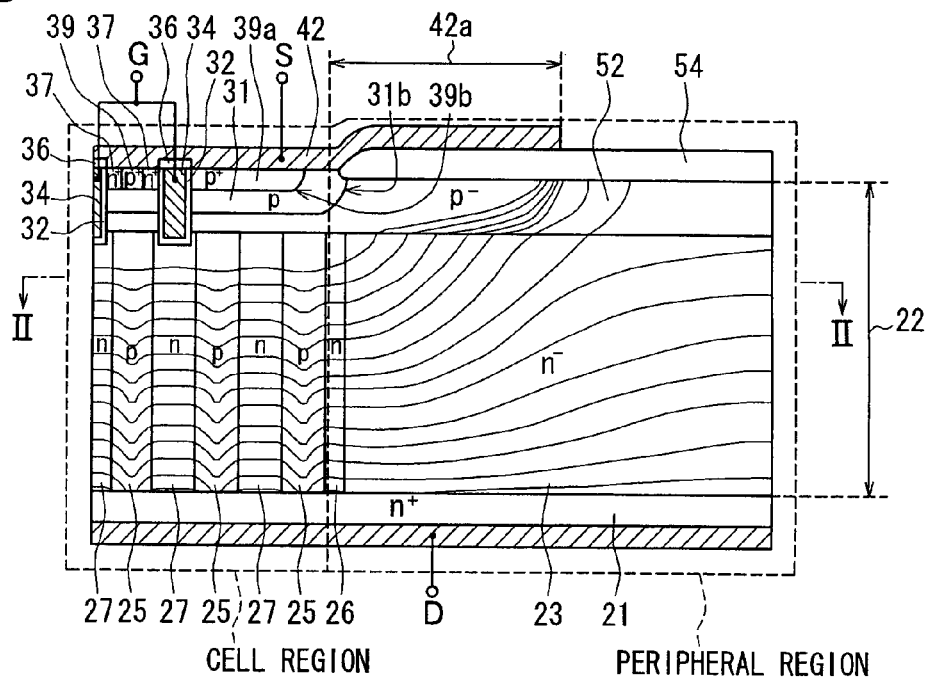
FIG. 3 shows a potential distribution of a peripheral region of the embodiment.

FIG. 3 shows a potential distribution when the semiconductor device is turned off. It is apparent from FIG. 3 that the depletion layer broadly expands in the lateral direction in the semiconductor lower layer 23 by providing the semiconductor lower layer 23 having a low impurity concentration, and thus a potential distribution is formed over a broad range of the semiconductor lower layer 23. Accordingly, the potential difference can be sufficiently held in the lateral direction in the peripheral region, and thus the withstand voltage of the peripheral region is determined by the width of the depleted region formed in the vertical direction. Furthermore, the field plate 42a is formed at the cell region side of the peripheral region, and thus the electric field concentration at a place (39b) having a large curvature of the outermost body contact region 39a and at a place (31b) having a large curvature of the body region 31 is moderated. Accordingly, no breakdown occurs at these curvature places (39b, 31b) in the semiconductor device. Since the withstand voltage is not limited by the curvature places (39b, 31b), and thus the withstand voltages of the cell region and the peripheral region are determined by the widths in the vertical direction of the depleted regions thereof. The electric field concentrates more greatly in the reduced surface field layer 52 at the lower side of the end portion of the field plate 42a as compared with the other regions. However, the impurity concentration of the reduced surface field layer 52 is sufficiently low, and thus no breakdown occurs in this region.

In the semiconductor device, the reduced surface field layer 52 is formed on the surface of the semiconductor lower layer 23 of the peripheral region. Accordingly, as shown in FIG. 3, the depletion layer expands in the reduced surface field layer 52. Since the depleted region is also formed within the reduced surface field layer 52 in the peripheral region, the width in the vertical direction of the depleted region of the peripheral region is equal to the total width of the semiconductor lower layer 23 and the reduced surface field layer 52. On the other hand, as shown in FIG. 3, the width in the vertical direction of the depleted region of the cell region is equal to the width from the bottom surface of the trench gate electrode 34 to the surface of the drain layer 21, that is, it is equal to substantially the width in the vertical direction of the SJ structure. Accordingly, the width in the vertical direction of the depleted region of the peripheral region is larger than the width of the depleted region of the cell region by the amount corresponding to the width from the bottom surface of the trench gate electrode 34 to the surface of the reduced surface field layer 52 (the width W shown in FIG. 1). Accordingly, the withstand voltage of the peripheral region is larger than the withstand voltage of the cell region. Specifically, it has been found that the withstand voltage of the peripheral region can be enhanced to 281V while the withstand voltage of the cell region is equal to 245V.

In the semiconductor device of this embodiment, the withstand voltage of the cell region is substantially the same as the conventional structure. However, this embodiment succeeds an increasing the withstand voltage of the peripheral region by forming the peripheral semiconductor layer 23 having a low concentration, the reduced surface field (RESURF) layer 52 and the field plate 42a. This embodiment has succeeded in achieving the withstand-voltage relationship of "cell region<peripheral region" by increasing the withstanding voltage of the peripheral region. Since the withstand voltage of the peripheral region is set to be larger than the withstand voltage of the cell region, breakdown can be induced preferentially in the cell region having a larger area when the L load surge breakdown resistance testing or the like is carried out. Accordingly, the avalanche energy per unit area can be reduced, and thus the situation that the semiconductor device is broken can be suppressed.

Furthermore, for reasons such as manufacturing tolerance, etc., this embodiment has an advantage that the reduction of the withstanding voltage of the peripheral region is suppressed even when the impurity concentration of the peripheral semiconductor lower layer 23 is disposed.

Figure 4:
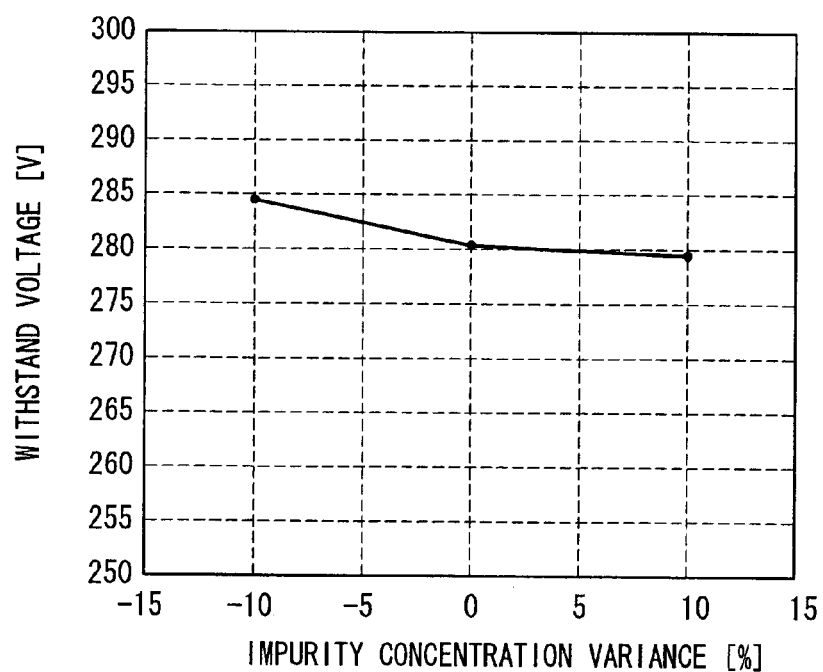
FIG. 4 shows the relationship between the impurity concentration dispersion of a peripheral semiconductor layer and the withstand voltage.

FIG. 4 shows the variation of the withstand voltage of the peripheral region when the impurity concentration of the semiconductor lower layer 23 varies. The withstand voltage when the impurity concentration is set to a value higher than the impurity concentration ($5 \times 10^{14}$ cm$^{-3}$) of this embodiment by 10% (+10%) is equal to 279V. Furthermore, the withstand voltage when the impurity concentration is set to a value lower than the impurity concentration of this embodiment by 10% (−10%) is equal to 284V. Even when dispersion of +10% occurs, the withstand voltage of the peripheral region varies only slightly. This means that the manufacturing tolerance is permitted and thus the semiconductor device can be manufactured with a high yield. The semiconductor device of this embodiment is also advantageous in easiness of manufacturing.

Figure 5:
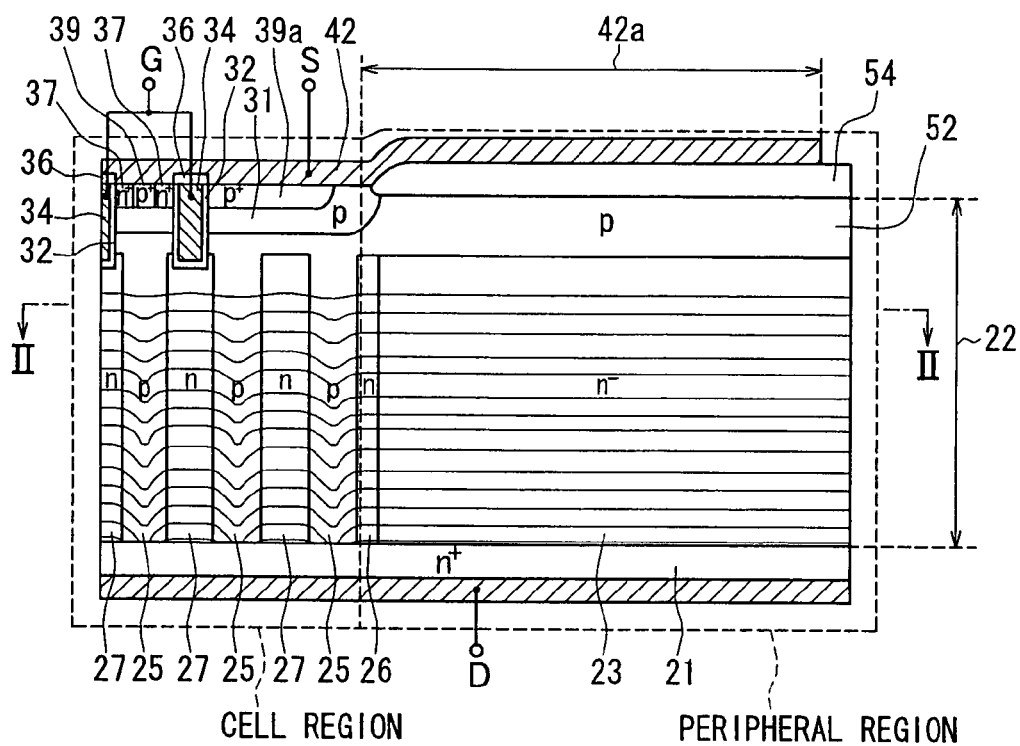
FIG. 5 shows a potential distribution of a peripheral region according to a comparison example.

FIG. 5 is a cross-sectional view showing the main part of the semiconductor device according to a modification, and shows a potential distribution when the semiconductor device is turned off. In this modification, the impurity concentration of the reduced surface field (RESURF) layer 52 is set to be equal to that of the p-type column 25 constituting the SJ structure. Furthermore, the field plate 42a is provided so as to extend to the periphery at a long distance. In this modification, it is formed so as to extend to the periphery by a length of 28 μm.

As described later with reference to the manufacturing method, when the p-type column 25 is formed by embedded epitaxial growth, the reduced surface field layer 52 of this modification can be integrally manufactured and achieved. Accordingly, this method has an advantage that the number of manufacturing steps is small. In this case, the withstand voltage of the peripheral region is equal to 265V. Accordingly, the relationship that the withstand voltage of the peripheral region is larger than the withstand voltage (245V) of the cell region can be achieved although the withstand voltage of the peripheral region is lower as compared with the embodiment. Accordingly, this modification can achieve the relationship of "cell region<peripheral region" with respect to the withstand voltage. According to this modification, both the reduction of the manufacturing cost and the increase of the withstand voltage of the peripheral region can be implemented.

Next, a main processing of manufacturing the semiconductor device according to the above embodiment will be described with reference to FIGS. 6 to 13. It should be noted that the illustrations of the figures used to describe the manufacturing method are not drawn to scale.

Figure 6:
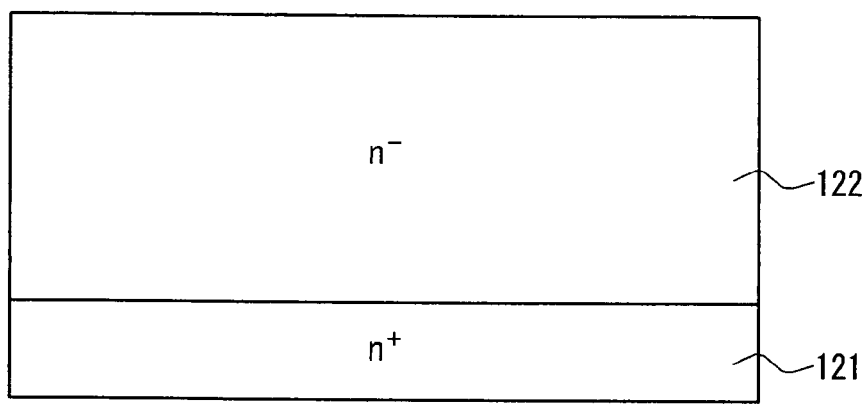
FIG. 6 is a diagram showing a step 1 of a manufacturing process of a semiconductor device.

First, there is prepared a semiconductor laminate in which an n⁻-type semiconductor layer 122 is formed on the surface of an n⁺-type semiconductor substrate 121 (including a high concentration of impurities, and it can be regarded substantially a conductor) as shown in FIG. 6. The semiconductor laminate may be achieved by epitaxially growing the semiconductor layer 122 from the surface of the semiconductor substrate 121, for example.

Figure 7:
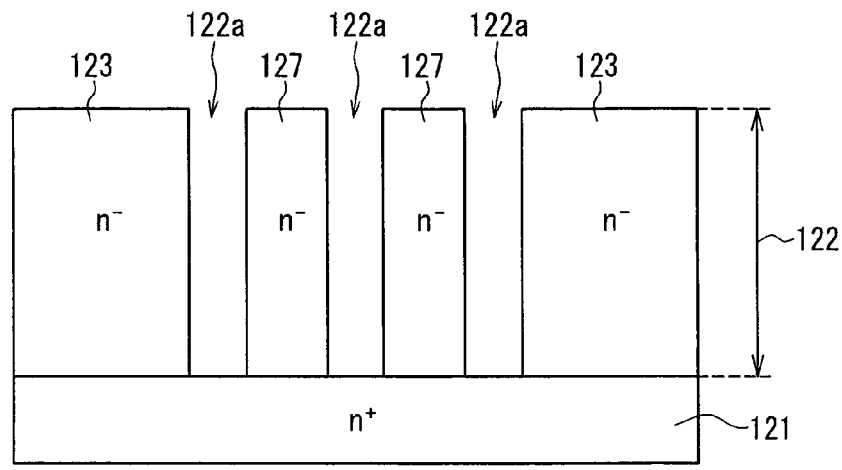
FIG. 7 is a diagram showing a step 2 of the manufacturing process of the semiconductor device.

Next, as shown in FIG. 7, a group of trenches 122a extending from the surface of the semiconductor layer 122 to the semiconductor substrate 121 is formed in a predetermined region at the center side of the semiconductor layer 122 by using a photolithography technique or the like. The trench 122a group may be formed by using dry-etching (anisotropic etching) such as RIE or the like, whereby plural semiconductor layers 127 are formed so that each of the semiconductor layers 127 is sandwiched between neighboring trenches 122a. In other words, the plural semiconductor layers 127 are formed so as to be away from one another. With respect to the plural semiconductor layers 127 within the center-side region, the distance from the side surface to the deep portion is short. On the other hand, with respect to the semiconductor layer 123 at the peripheral side, the distance from the side surface to the deep portion is long. The plural semiconductor layers 127 in the center-side region will serve as the n-type columns having the SJ structure, and the semiconductor layer 123 at the peripheral side will serve as the peripheral semiconductor lower layer.

Figure 8:
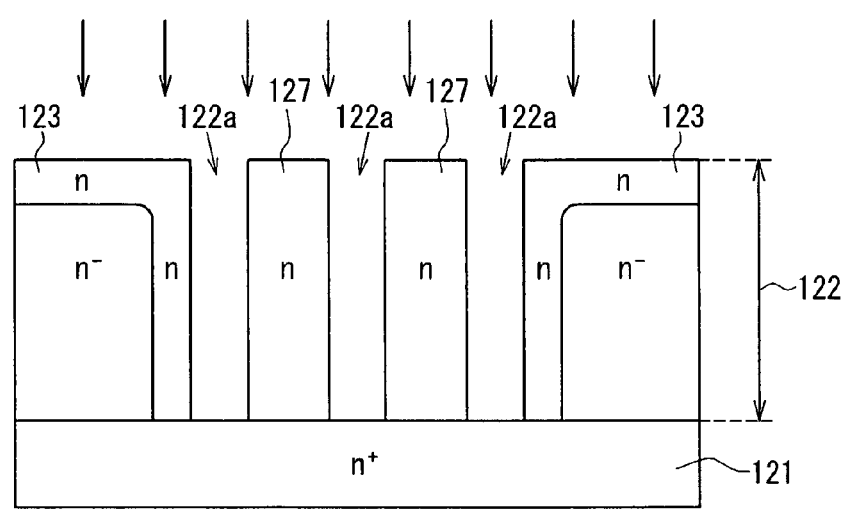
FIG. 8 is a diagram showing a step 3 of the manufacturing process of the semiconductor device.

Next, a gas-phase diffusion method using gas including phosphine (PH₃) is carried out as shown in FIG. 8. When the semiconductor laminate is exposed to gas, impurities are doped into the semiconductor layer 122 through the surface of the semiconductor layer 122 and the side surfaces of the semiconductor layer 122 for defining the trenches 122a, that is, the exposed surface of the semiconductor layer 122. The impurities are isotropically diffused and doped. With respect to the plural semiconductor layers 127 in the center-side region, the distance from the side surfaces of each semiconductor layer 127 which define the trenches 122a formed at both the sides of the semiconductor layer 127 concerned to the deep portion thereof is short, and thus the impurities are doped to the deep portions of the semiconductor layers 127. The impurities can be doped into the whole bodies of the semiconductor layers 127 in the center-side region by adjusting the doping depth to be half or more of the width of the semiconductor layer. Accordingly, the impurity concentrations of the semiconductor layers 127 in the center-side region are uniformly increased as compared with the impurity concentrations of the semiconductor layers 127 at the stage that they are prepared. On the other hand, with respect to the semiconductor layer 123 at the peripheral side, the impurities are doped from the side surface to a predetermined distance portion, however, the impurities are not doped until the deep portion. In place of the gas-phase diffusion method, an oblique ion implanting method, a solid-phase diffusion method or the combination thereof may be used.

Figure 9:
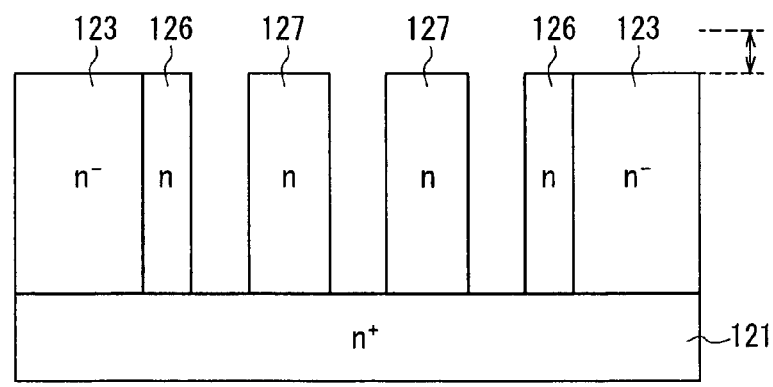
FIG. 9 is a diagram showing a step 4 of the manufacturing process of the semiconductor device.

Subsequently, as shown in FIG. 9, the surface of the semiconductor layer 122 is polished to remove the impurities-doped area in the neighborhood of the surface of the semiconductor layer 122 in which the impurities are doped, whereby the plural semiconductors 127 which are high in impurity concentration and separated away from one another are formed in the center-side region. Furthermore, the semiconductor layer 123 that is not varied in impurity concentration is formed at the peripheral side. An n-type region 126 whose width is substantially a half of the width of each of the other semiconductor layers 127 at the center side is formed at the outermost peripheral side in the center-side region (or it may be regarded as the innermost peripheral region of the semiconductor layer 123 at the peripheral side). The n-type region 126 serves as the boundary n-type column 26 shown in FIG. 1. In other words, the semiconductor device formed by using the manufacturing method described above is necessarily equipped with the n-type region 126 having substantially the same concentration as the other n-type columns and the width smaller than the widths of the other n-type columns in the region extending along the repetitive direction of the SJ structure. It can be concluded that when such an n-type region 126 exists, the manufacturing method described above is used.

Figure 10:
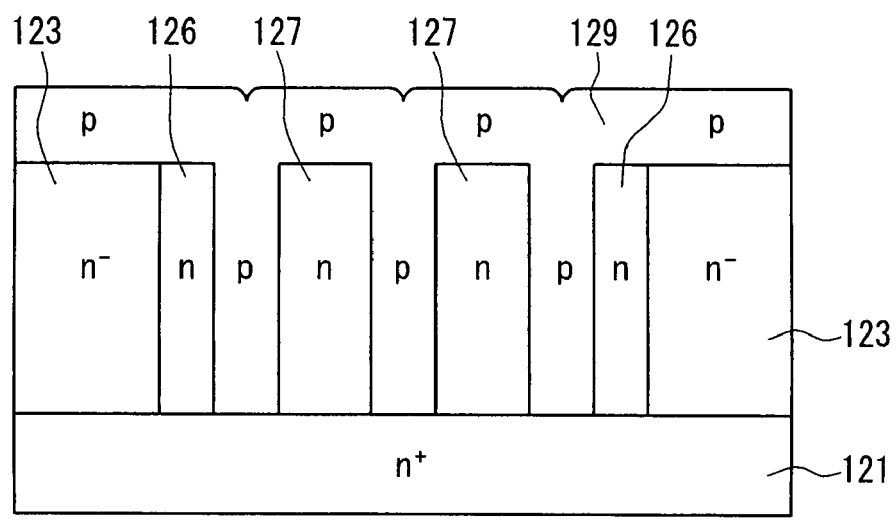
FIG. 10 is a diagram showing a step 5 of the manufacturing process of the semiconductor device.

Subsequently, as shown in FIG. 10, the p-type semiconductor 129 is formed in the trench 122a group by embedded epitaxial growth. The embedded epitaxial growth is carried out until the surfaces of the semiconductor layers 123, 127 are covered by the semiconductor 129.

Figure 11:
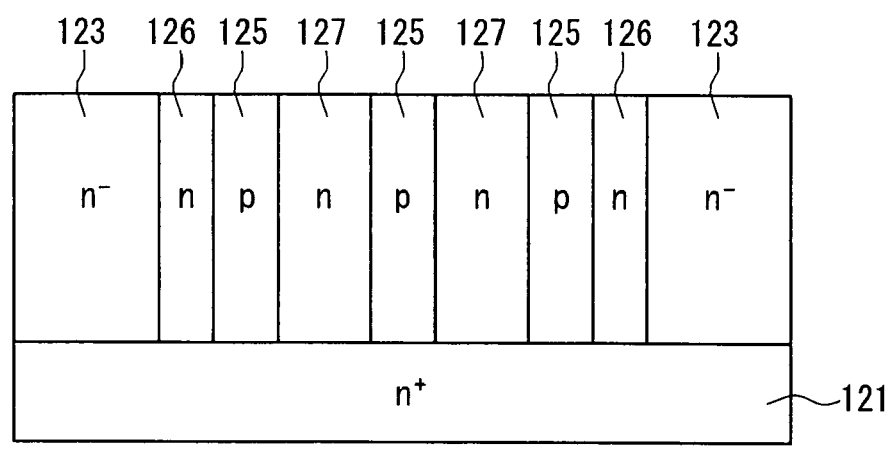
FIG. 11 is a diagram showing a step 6 of the manufacturing process of the semiconductor device.

Subsequently, as shown in FIG. 11, a part of the semiconductor 129 which covers the surfaces of the semiconductor layers 123, 127 is polished to expose the semiconductor layers 123, 127 and the filled trench group 125, thereby achieving the structure that the combination of the n-type portion region and the p-type portion region is repetitively formed, that is, the SJ structure.

Figure 12:
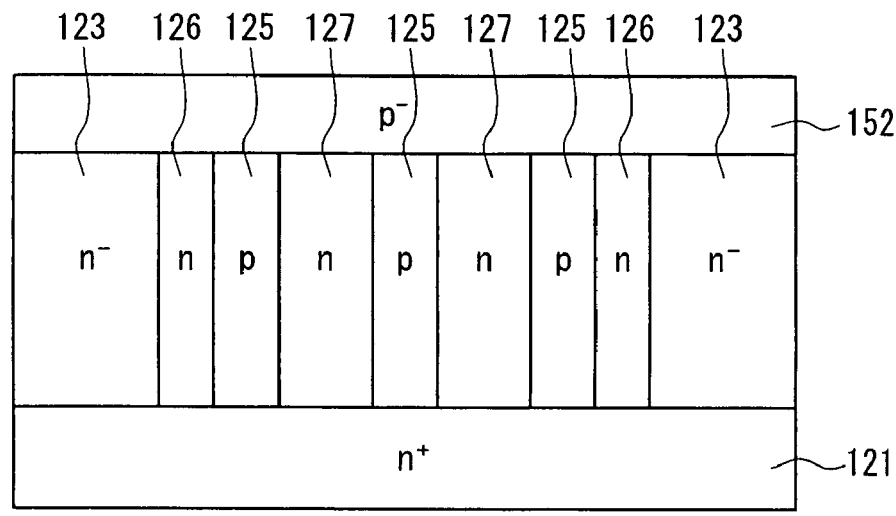
FIG. 12 is a diagram showing a step 7 of the manufacturing process of the semiconductor device.
Figure 13:
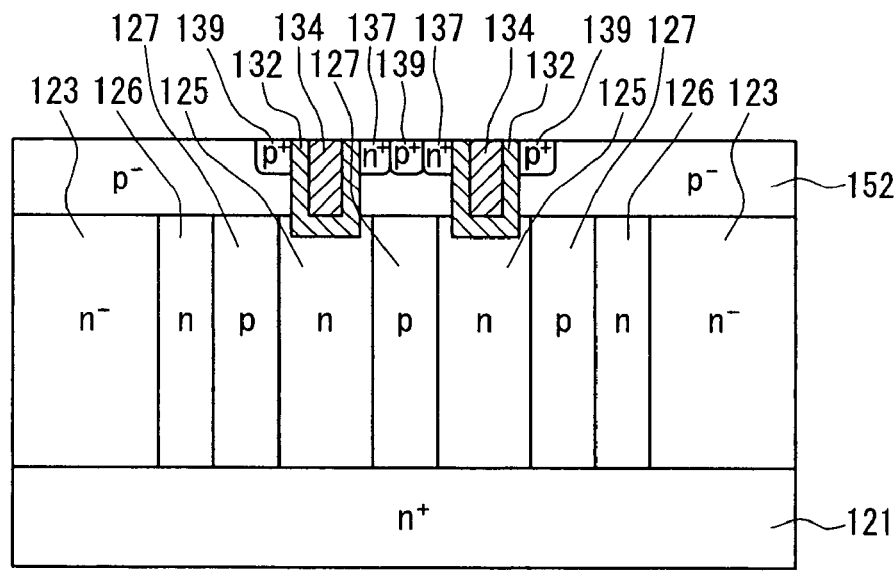
FIG. 13 is a diagram showing a step 8 of the manufacturing process of the semiconductor device

Subsequently, as shown in FIG. 12, the p⁻-type reduced surface field (RESURF) layer 152 is epitaxially grown on the surfaces of the SJ structure and the peripheral semiconductor layer 123.

Subsequently, by using an existing manufacturing method or a manufacturing technique which is obvious to persons skilled in the art, each of the structures of a trench gate electrode 134, a source region 137, a body contact region 139, etc. are further formed in connection with the portion at which the SJ structure is formed. Thereafter, field oxide film, a field plate, a drain electrode, etc. are formed to thereby achieve the semiconductor device of this embodiment.

In the manufacturing method described above, the step of epitaxially growing the p⁻-type RESURF layer 152 shown in FIG. 12 may be omitted. That is, as shown in FIG. 10, the portion of the semiconductor 129 which are coated on the surfaces of the semiconductor layers (123, 127) formed when the semiconductor 129 is formed by the embedded epitaxial growth is polished so as to have the same thickness as the RESURF layer 152, whereby the epitaxial growth step can be emitted. In this case, the number of manufacturing steps can be reduced, and the manufacturing cost can be reduced.

The above embodiments are merely examples of the present invention, and thus the present invention is not limited to the above embodiments. Various modifications and alterations can be made to the above embodiments without departing from the subject matter of the present invention.

Furthermore, the technical elements of the specification and the drawings exhibit technical utility solely or in combination, and the present invention is not limited to the combinations described in the specification, the drawings and the claims. Still furthermore, the technique disclosed in this specification and the drawings can achieve plural objects at the same time, and achievement of one of these objects has also technical utility.

What is claimed is:

1. A method of manufacturing a semiconductor device having a cell region having a vertical semiconductor switching cell group formed therein and a peripheral region located on a periphery of the cell region, comprising:
   preparing a semiconductor laminate of a first conductivity-type semiconductor layer and a first conductivity-type semiconductor substrate, a concentration of first conductivity-type impurities of the semiconductor layer being lower than the semiconductor substrate;
   forming a trench group extending from an upper surface of the semiconductor layer to a back surface of the semiconductor layer to form plural sections of the semiconductor layer such that a distance between opposite sides of each one of the sections formed at the peripheral region is so long that impurities cannot be doped deeply and a distance between opposite sides of each one of sections formed at a region other than the peripheral region is so short that impurities can be doped deeply;
   doping first conductivity-type impurities to an exposed surface of the semiconductor layer so that concentration of the first conductivity type impurities of the sections formed at a region other than an outermost portion of the peripheral region becomes higher than the semiconductor layer at the stage that they are prepared and lower than the substrate layer at the stage that they are prepared;
   removing a surface neighboring region of the semiconductor layer doped with the first conductivity-type impurities formed on the upper surface of the semiconductor layer; and
   filling a semiconductor material including second conductivity-type impurities into the trench group.

2. The manufacturing method according to claim 1, wherein doping first conductivity-type impurities to an exposed surface of the semiconductor layer includes an annealing process and further comprises exposing the exposed surface of the semiconductor layer to gas including first conductivity-type impurities.

3. The manufacturing method according to claim 1, further comprising:
   removing the semiconductor material including the second conductivity-type impurities covering the surface of the semiconductor layer to expose the filled trench group after the filling of the semiconductor material; and
   forming a semiconductor upper layer including second conductivity-type impurities on the upper surface of the semiconductor layer and the filled trench group including second-conductivity type impurities by crystal growth after the removing.

4. The manufacturing method according to claim 3, further comprising:
   forming a structure of a trench gate, a source region, and a body contact region on the semiconductor upper layer; and
   forming a field oxide film, a field plate, and a drain electrode at the structure.

5. A method of manufacturing a semiconductor device including a cell region, with a vertical semiconductor switching cell group formed therein, and a peripheral region located on a periphery of the cell region, comprising:
   preparing a semiconductor laminate including a first conductivity-type semiconductor layer and a first conductivity-type semiconductor substrate, an impurity concentration in the first conductivity-type semiconductor layer being less than an impurity concentration in the first conductivity-type semiconductor substrate;
   forming a trench group extending from an upper surface of the first conductivity-type semiconductor layer to a back surface of the first conductivity-type semiconductor thereby forming a plurality of sections of the semiconductor layer, the plurality of section including
      first sections formed at the peripheral region, each first section characterized by a width such that impurities cannot be doped deeply and
      second sections formed away from the peripheral region, each second section characterized by a width such that impurities can be doped deeply;
   doping first conductivity-type impurities to an exposed surface of the semiconductor layer such that a concentration of the first conductivity type impurities in the second sections becomes higher than a concentration of first conductivity type impurities in the first conductivity-type semiconductor layer as originally prepared and the concentration of the first conductivity type impurities in the second sections are lower than a concentration of first conductivity type impurities in the substrate layer as originally prepared;
   removing a surface neighboring region from the plurality of sections of the semiconductor layer doped with the first conductivity-type impurities; and
   filling a semiconductor material including second conductivity-type impurities into the trench group.

* * * * *